United States Patent [19]
Moldavsky

[11] Patent Number: 6,061,608
[45] Date of Patent: May 9, 2000

[54] PRECISION DISPENSING PROCESS CONTROL

[75] Inventor: Boris Moldavsky, Dana Point, Calif.

[73] Assignee: Raytheon Company, Lexington, Mass.

[21] Appl. No.: 08/927,129

[22] Filed: Sep. 2, 1997

[51] Int. Cl.$^7$ .................................................. G06F 19/00
[52] U.S. Cl. ........................... 700/240; 700/231; 222/55
[58] Field of Search .................................. 222/55, 58, 77, 222/400.8; 700/117, 121, 231, 240

[56] References Cited

U.S. PATENT DOCUMENTS

| | | | |
|---|---|---|---|
| 4,133,290 | 1/1979 | Melliger ........................................ | 118/7 |
| 4,605,297 | 8/1986 | Livingston et al. ........................ | 222/58 |
| 4,938,383 | 7/1990 | Yamazaki et al. .................. | 364/468.28 |
| 5,019,409 | 5/1991 | Wesling et al. ............................. | 427/96 |
| 5,334,245 | 8/1994 | Hartnett et al. ............................. | 118/59 |
| 5,375,634 | 12/1994 | Egger ........................................ | 141/83 |

*Primary Examiner*—Paul P. Gordon
*Attorney, Agent, or Firm*—Leonard A. Alkov; William C. Schubert; Glenn H. Lenzen, Jr.

[57] ABSTRACT

An apparatus and method that precisely controls the amount of liquid dispensed from dispensing apparatus onto an article. The present invention controls the weight of the dispensed liquid by using a force transducer that precisely weighs the article and dispensed liquid during the dispensing process. This weight value is input to a computer controller of an automatic dispenser that embodies a computer program that controls a liquid dispensing pump. Liquid is dispensed until the desired weight of liquid that is to be dispensed is reached, defined by an upper limit in the program. The flow of dispensed liquid is reduced when the weight limit is approached, and is stopped when the weight limit is reached. Thus, in the present invention, the weight (or volume) of the dispensed liquid is controlled in real time during the dispensing process. Closed loop control of the dispensing pump using liquid weight as the controlling variable improves the volumetric accuracy and repeatability of the dispensing process.

10 Claims, 2 Drawing Sheets

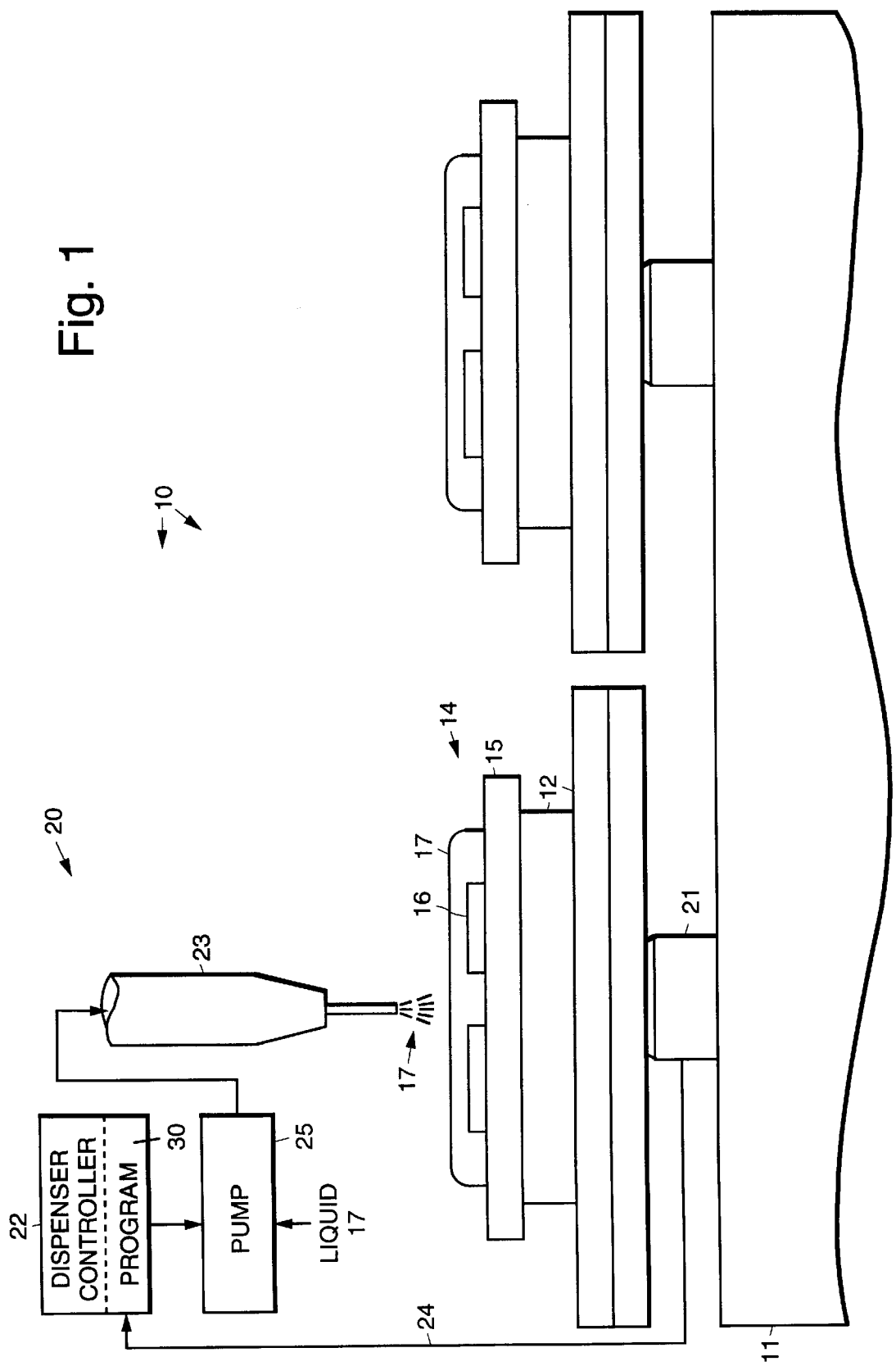

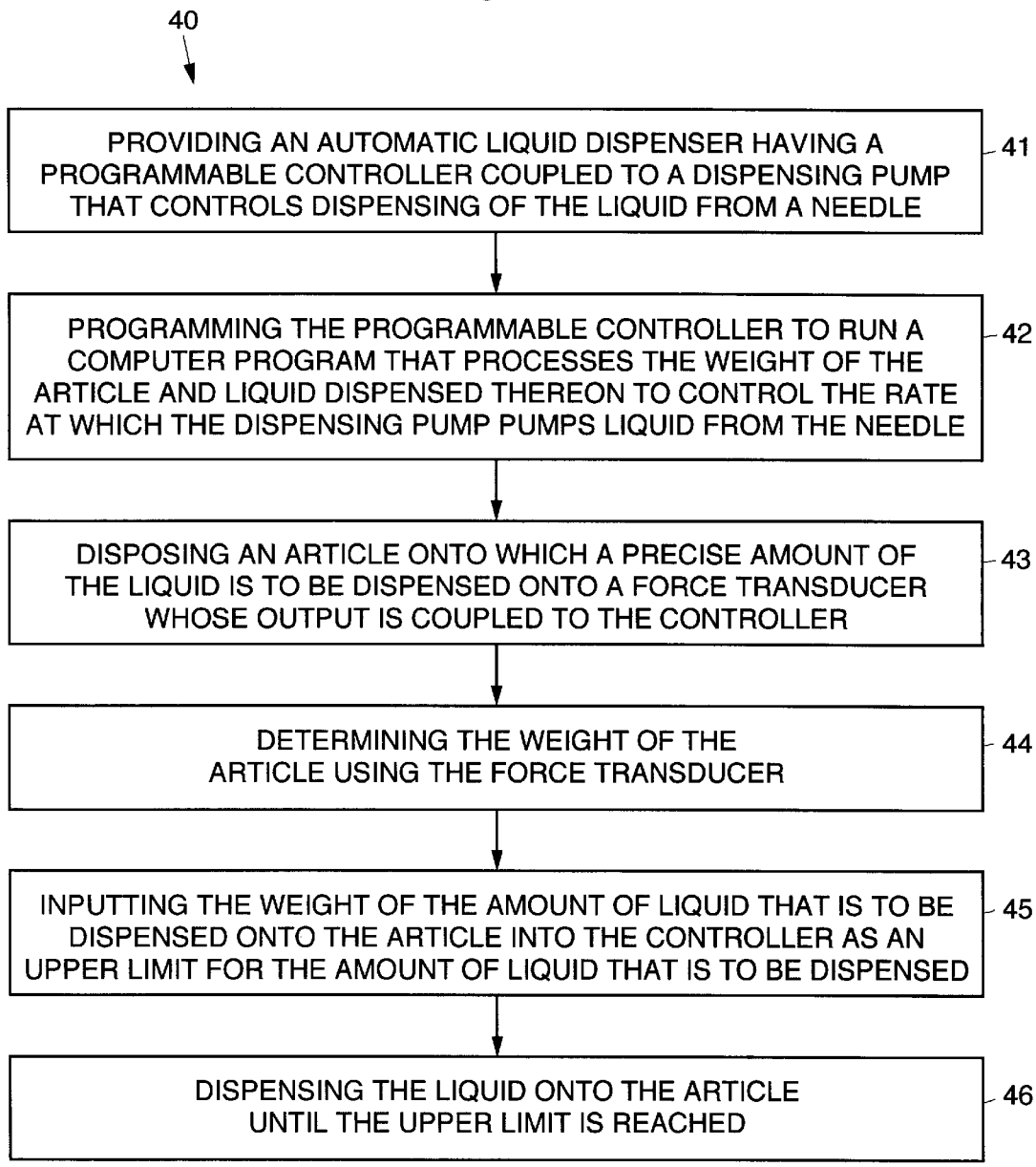

PRECISION DISPENSING PROCESS CONTROL

BACKGROUND

The present invention relates generally to apparatus and methods that control dispensing of liquids, and more particularly, to an apparatus and method for precisely dispensing a controlled amount of liquid, such as epoxy, such as when it is applied to a surface of a manufactured component, for example.

Heretofore, control over the application of an epoxy or other liquid material, for example, to the surface of a printed wiring board to encapsulate or secure components thereon has been achieved by using a mass flow calibration method. The mass flow calibration method is based on a weight measurement of a sample of the epoxy. If the viscosity of the liquid epoxy changes, the dispensing apparatus automatically adjusts its dispensing parameters to dispense the desired volume of the liquid. The disadvantage of this method is that it uses indirect measurements, and it is insensitive to intermittent problems such as needle plugging or other hardware problems.

Therefore, there is a need for a reliable accurate method of providing control over the dispensing of a liquid, such as epoxy.

Accordingly, it is an objective of the present invention to provide for an apparatus and method for precisely dispensing a controlled amount of liquid. It is a further objective of the present invention to provide for an apparatus and method for precisely dispensing a liquid, such as epoxy, onto a surface of a component.

SUMMARY OF THE INVENTION

To accomplish the above and other objectives, the present invention provides for an apparatus and method that precisely controls the amount of liquid, such as epoxy, that is dispensed from a dispensing apparatus, such as a dispensing needle, for example. The present apparatus and method controls the weight of the dispensed liquid by using a precise weight measuring work holding device mounted on a table of an automatic dispenser having a computer controller. The precise weight measuring work holding device comprises a force transducer that is used to detect and continuously monitor small changes in the weight of the article during the, dispensing process. A digital output signal from the weight measuring device that is indicative of the weight of the dispensed liquid is sent as an input to the controller of the dispenser. This digital output signal is processed by computer software in the controller to generate parametric changes relating to the dispensing parameters. As the weight of the dispensed liquid approaches a pre-established lower limit set in the program, the flow of dispensed liquid is reduced and is eventually stopped, when an upper limit is reached. This data may also be saved to a file for future analysis.

One novel aspect of the present invention is that the weight (or volume) of the dispensed liquid is controlled in real time during the dispensing process. Closed loop control of the dispensing pump using liquid weight as the controlling variable improves the volumetric accuracy and repeatability of the dispensing process. The present invention provides for direct volume control during dispensing of liquids in real time and is the most efficient and accurate method for dispensing liquids, such as epoxy.

As was mentioned in the Background section, currently used methods for controlling a dispensing process are based on accurate control of dispensing parameters or indirect measurements of the viscosity of the dispensed liquids. The present dispensing control apparatus and method is universal. The present apparatus and method is independent of liquid viscosity, dispensing pumps, or environment. Unlike prior art approaches, the present invention can detect dispensing problems such as a plugged dispensing needle at the time of its occurrence.

The present invention is particularly applicable in chip-on-board manufacturing processes, reworkable and non-reworkable encapsulation processes, and die attachment processes, and the like.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 1 illustrates an embodiment of apparatus in accordance with the principles of the present invention for precisely dispensing a controlled amount of liquid; and FIG. 2 illustrates a method in accordance with the principles of the present invention that is implemented in the apparatus of FIG. 1.

DETAILED DESCRIPTION

Referring to the drawing figures, FIG. 1 illustrates an embodiment of apparatus 10 in accordance with the principles of the present invention for precisely dispensing a controlled amount of a liquid 17, such as epoxy, for example, onto an article 14. The article 14, may be a printed wiring board 15 or a multichip module 14, for example, that has components 16 disposed on a top surface thereof that require a precisely controlled amount of bonding or encapsulation liquid 17 disposed thereon.

The apparatus 10 comprises an automatic liquid dispenser 20 having a computer controller 22 and a dispensing pump 25. The automatic liquid dispenser 20 has a work table 11 onto which one or more force transducers 21 are disposed. Each article 14 onto which the liquid 17 is to be dispensed is disposed on top of a tooling plate 12 which is in turn disposed on top of the force transducer 21. The force transducer 21 continuously outputs a digital output signal 24 that is indicative of the weight of the tooling plate 12, the article 14, and the liquid 17 when it is dispensed. The force transducer 21 is thus used to detect and continuously monitor small changes in the weight of the article 14 during the liquid dispensing process. The digital output signal 24 is input to the computer controller 22 for processing by a computer software program 30 that implements the present method 40.

The automatic liquid dispenser 20 comprises a liquid dispensing needle 23 that outputs a controlled amount of liquid 17 under control of the controller 22. In accordance with the present invention, prior to dispensing liquid 17 onto the article 14, the weight of the tooling plate 12 and the article 14 are determined using the force transducer and this weight value is into the software program 30. The desired weight of the liquid 17 that is to be dispensed onto the article 14 is input into the program 30. This sets a predetermined upper weight limit or threshold that is used to terminate the liquid dispensing process. The liquid 17 is then pumped by the dispensing pump 25 and dispensed by way of the dispensing needle 23 onto the article in the manner required by the particular manufacturing process for the article 14. The weight of the tooling plate 12, the article 14 and the dispensed liquid 17 are continuously monitored by way of the transducer 21, and the output signal 24 indicative of the total weight is input to the program 30. The controller 22 controls the pump 25 and in particular, the rate at which the liquid 17 is dispensed. As the weight of the dispensed liquid 17 approaches a pre-established lower limit set in the program 30, the flow rate of dispensed liquid 17 is reduced and is eventually stopped, when a predefined upper limit is reached. The computer software program 30 in the controller 22 generates parametric changes that control to the dispensing parameters.

A key aspect of the present invention is that the weight (or volume) of the dispensed liquid 17 is controlled in real time during the dispensing process. Closed loop control of the dispensing pump 22 using weight of the liquid 17 as a controlling variable improves the volumetric accuracy and repeatability of the dispensing process. The present invention provides for direct volume control during dispensing of liquids in real time and is the most efficient and accurate approach for dispensing liquids, such as epoxy, and the like.

The present invention thus eliminates the need for accurate control of dispensing parameters or indirect measurements of the viscosity of the dispensed liquids. The present dispensing control apparatus and method are independent of liquid viscosity, dispensing pumps, or dispensing environment. The present invention may be used to dispense any liquid, and is not limited to epoxy, for example. The present invention can detect dispensing problems such as a plugged dispensing needle 23 at the time of its occurrence. This is easily achieved by monitoring the amount of liquid 17 that is dispensed on the item. If the dispensing needle 23 becomes plugged, the weight output signal from the transducer 21 does not change with time. Therefore, this provides an indication of a plugged dispensing needle 23.

The present invention may be used in chip-on-board manufacturing processes, reworkable and non-reworkable encapsulation processes, and die attachment processes, and the like, such as those employed by the assignee of the present invention.

For the purposes of completeness, FIG. 2 illustrates one method 40 of precisely dispensing a controlled amount of liquid 17 onto an article 14, and which may be implemented using the apparatus 10 of FIG. 1. The present method 40 comprises the following steps.

An automatic liquid dispenser 20 having a programmable controller 22 that is coupled to a dispensing pump 25 that controls dispensing of the liquid 17 from a dispensing needle 23 is provided 41. The programmable controller 22 is programmed 42 to run a computer program 30 that processes the weight of the article 14 and liquid 17 dispensed thereon to control the rate at which the dispensing pump 25 pumps liquid from the dispensing needle 23.

An article 14 onto which a precise amount of the liquid 17 is to be dispensed is disposed 43 onto a force transducer 21 whose output is coupled to the controller 22. The weight of the article 14 is determined 44 using the force transducer and is input to the controller 22. The weight of the amount of liquid 17 that is to be dispensed onto the article 17 is input 45 to the controller 22 as an upper limit for the amount of liquid 17 that is to be dispensed. The liquid 17 is dispensed 46 onto the article 14 until the upper limit is reached. Thus, the amount of liquid 17 applied to the article 14 is precisely determined using the weight of the dispensed liquid 17 as a controlling variable.

Thus, an apparatus and method for precisely dispensing a controlled amount of liquid have been disclosed. It is to be understood that the described embodiments are merely illustrative of some of the many specific embodiments that represent applications of the principles of the present invention. Clearly, numerous and other arrangements can be readily devised by those skilled in the art without departing from the scope of the invention.

What is claimed is:

1. Apparatus for precisely dispensing a controlled amount of a liquid onto an article, said apparatus comprising:

an automatic liquid dispenser comprising a programmable controller, a dispensing pump coupled to a dispensing needle that dispenses the liquid, and a work table;

a force transducer disposed on the work table that outputs an output signal indicative of the weight of items disposed thereon;

a tooling plate disposed on the force transducer;

an article onto which the liquid is to be dispensed disposed on the tooling plate;

a computer program disposed on the computer controller that is programmed with a predetermined weight limit that is indicative of the desired weight of the liquid that is to be dispensed onto the article, and which processes the output signal while the liquid is dispensed onto the article, and which controls the pump to terminate dispensing of the liquid onto the article when the predetermined weight limit is reached.

2. The apparatus of claim 1 wherein the computer program controls dispensing parameters of the pump to control the rate of liquid dispensed from the dispensing needle.

3. The apparatus of claim 1 wherein the computer program controls the flow rate of the liquid dispensed from the pump, which is reduced and eventually stopped when the limit is reached.

4. The apparatus of claim 1 wherein the liquid comprises epoxy.

5. The apparatus of claim 1 wherein the computer program contains a predetermined lower limit, and the controller controls the flow of dispensed liquid to reduce the flow of dispensed liquid once the lower limit is reached and stop the flow of dispensed liquid when the predetermined weight limit is reached.

6. A method of precisely dispensing a controlled amount of liquid onto an article, said method comprising the steps of:

providing an automatic liquid dispenser having a programmable controller that is coupled to a dispensing pump that controls dispensing of the liquid from a dispensing needle;

programming the programmable controller to run a computer program that processes the weight of the article and liquid dispensed thereon to control the rate at which the dispensing pump pumps liquid from the dispensing needle;

disposing an article onto which a precise amount of the liquid is to be applied onto a force transducer whose output is coupled to the controller;

determining the weight of the article using the force transducer;

inputting the weight of the amount of liquid that is to be dispensed onto the article into the controller to provide an upper limit for the amount of liquid that is to be dispensed; and dispensing the liquid onto the article until the upper limit is reached;

and wherein the amount of liquid applied to the article is precisely determined using the weight of the dispensed liquid as a controlling variable.

7. The method of claim 6 wherein the computer program controls the flow rate of the liquid dispensed from the pump, which is reduced and eventually stopped when the limit is reached.

8. The method of claim 6 wherein the liquid comprises epoxy.

9. The method of claim 6 wherein the computer program controls dispensing parameters of the pump to control the rate of liquid dispensed from the dispensing needle.

10. The method of claim 6 wherein the computer program contains a predetermined lower limit, and the controller controls the flow of dispensed liquid to reduce the flow of dispensed liquid once the lower limit is reached and stop the flow of dispensed liquid when the predetermined weight limit is reached.

* * * * *